(12) United States Patent
Gullapalli

(10) Patent No.: US 10,229,234 B2
(45) Date of Patent: Mar. 12, 2019

(54) METHOD AND APPARATUS TO FACILITATE SIMULATING A CIRCUIT CONNECTED TO A MULTIPORT INTERCONNECT STRUCTURE

(71) Applicant: Kiran Kumar Gullapalli, Austin, TX (US)

(72) Inventor: Kiran Kumar Gullapalli, Austin, TX (US)

(73) Assignee: NXP USA, Inc., Austin, TX (US)

( * ) Notice: Subject to any disclaimer, the term of this patent is extended or adjusted under 35 U.S.C. 154(b) by 1286 days.

(21) Appl. No.: 14/167,671

(22) Filed: Jan. 29, 2014

(65) Prior Publication Data

US 2015/0213171 A1 Jul. 30, 2015

(51) Int. Cl.
*G06F 17/50* (2006.01)

(52) U.S. Cl.
CPC .............................. *G06F 17/5036* (2013.01)

(58) Field of Classification Search
CPC .. G06F 17/50; G06F 17/5045; G06F 17/5009; G06F 17/5036
USPC ........................................................ 703/14
See application file for complete search history.

(56) References Cited

U.S. PATENT DOCUMENTS

| | | | | |
|---|---|---|---|---|
| 5,600,579 A | * | 2/1997 | Steinmetz, Jr. ..... | G06F 17/5022 700/29 |
| 5,819,074 A | * | 10/1998 | Mangelsdorf ....... | G06F 17/5022 703/15 |
| 5,880,975 A | * | 3/1999 | Mangelsdorf ....... | G06F 17/5022 703/15 |
| 5,949,990 A | * | 9/1999 | Mangelsdorf ....... | G06F 17/5022 703/14 |
| 5,956,498 A | * | 9/1999 | Mangelsdorf ........... | G06F 8/443 703/16 |
| 6,308,304 B1 | * | 10/2001 | Devgan ............... | G06F 17/5036 716/111 |
| 6,466,898 B1 | * | 10/2002 | Chan ................... | G06F 17/5022 703/14 |

(Continued)

OTHER PUBLICATIONS (Mangold et. al., Full-Wave Modeling and Automatic Equivalent-Circuit Generation of Millimeter-Wave Planar and Multilayer Structures, IEEE Transactions on Microwave Theory and Techniques, vol. 47, No. 6, Jun. 1999;).*

(Continued)

*Primary Examiner* — Aniss Chad
*Assistant Examiner* — Justin C Mikowski

(57) ABSTRACT

A method facilitates simulating a plurality of circuit elements connected to a multiport interconnect structure having a first set of ports. The method includes: receiving a first set of data that models electrical behavior of the first set of ports and a first portion of the plurality of circuit elements; determining a first subset of the first data, which models electrical behavior of a set of exposed ports of the first set of ports, and a second subset of the first data, which models electrical behavior of a set of non-exposed ports of the first set of ports and the first portion of the plurality of circuit elements; and combining the second subset of the first data into the first subset of the first data to generate a second set of data that models electrical behavior of a second interconnect structure having fewer ports than the multiport interconnect structure.

20 Claims, 5 Drawing Sheets

(56) References Cited

U.S. PATENT DOCUMENTS

| | | | | |
|---|---|---|---|---|
| 7,409,328 | B1* | 8/2008 | McGaughy | G06F 17/5036 703/14 |
| 7,797,140 | B2* | 9/2010 | Lee | G06F 17/5036 703/13 |
| 7,827,016 | B1* | 11/2010 | Ho | G06F 17/5009 703/13 |
| 7,865,348 | B1* | 1/2011 | Au | G06F 17/5036 703/13 |
| 8,275,597 | B1* | 9/2012 | Oh | G06F 17/5036 703/14 |
| 8,428,928 | B1* | 4/2013 | McGaughy | G06F 17/5036 703/14 |
| 8,806,415 | B1* | 8/2014 | Ding | G06F 17/5036 703/14 |
| 2004/0162716 | A1* | 8/2004 | Dorfman | G06F 17/5036 703/15 |
| 2005/0197816 | A1* | 9/2005 | Inukai | G06F 17/5036 703/14 |
| 2013/0080983 | A1* | 3/2013 | Craig | G06F 17/5081 716/107 |
| 2015/0058859 | A1* | 2/2015 | Janssen | G06F 9/52 718/104 |

OTHER PUBLICATIONS

Achar et. al., Passive Interconnect Reduction Algorithm for Distributed/Measured Networks, IEEE Transactions on Circuits and Systems—II: Analog and Digital Signal Processing, vol. 47, No. 4, Apr. 2000.*

B. Gustavsen and A. Semlyen, "Rational approximation of frequency domain responses by Vector Fitting", IEEE Trans. Power Delivery, Jul. 1999, pp. 1052-1061, vol. 14, No. 3.

B. Gustavsen, "Improving the pole relocating properties of vector fitting", IEEE Trans. Power Delivery, Jul. 2006, pp. 1587-1592, vol. 21, No. 3.

D. Deschrijver, M. Mrozowski, T. Dhaene, and D. DeZytter, "Macromodeling of Multiport Systems Using a Fast Implementation of the Vector Fitting Method", IEEE Microwave and Wireless Components Letters, Jun. 2008, pp. 383-385, vol. 18, No. 6.

Zuochang Ye, et al., "Extended Hamilton Pencil for Passivity Assessment and Enforcement for S-Parameter Systems," EDAA, 2010, 1148-1152, 978-3-9810801-6-2.

* cited by examiner

METHOD AND APPARATUS TO FACILITATE SIMULATING A CIRCUIT CONNECTED TO A MULTIPORT INTERCONNECT STRUCTURE

FIELD

The present disclosure relates generally to circuit simulation and more particularly to a method and apparatus to facilitate simulating a circuit connected to a multiport interconnect structure.

BACKGROUND

Circuit simulation uses mathematical models, also referred to herein simply as models, to replicate the behavior of an actual circuit. Simulating circuit behavior before actually building the circuit can improve design efficiency by making faulty designs known and providing insight into the behavior of the circuit. In particular, for integrated circuits (ICs), photomasks used to create the ICs are expensive, and breadboarding is generally impractical due to the large numbers of devices or circuit components, e.g., sometimes thousands of transistors, that the circuit contains. Therefore, circuit simulation may be the most time and cost efficient alternative for designing ICs.

Many of the circuit simulation systems used today contain circuit simulation engines, also called analysis engines, that execute software derived from a general-purpose, open source analog circuit simulator called Simulation Program with Integrated Circuit Emphasis (SPICE). SPICE-based circuit simulation systems generally contain a library of models, also referred to herein as compact models, which mathematically describe the behavior of a variety of linear circuit elements such as resistors, capacitors, and inductors and nonlinear circuit elements such as transistors, which can be characterized and modeled as lumped circuit elements. Using these models, a SPICE-based analysis engine can perform a time domain analysis, also referred to herein as a transient analysis, to predict circuit behavior for a wide range of different circuits.

However, the SPICE-based analysis engine can be inept when analyzing electrical systems that include a circuit element for which no compact model exists within the simulation system library and the behavior of which is more accurately modeled as a distributed circuit element based on the physics of the circuit element, such as when simulating an IC package that includes a circuit connected to a multiport interconnect structure. Particularly, a vast shortcoming can be the amount of time associated with simulating an electrical system that contains a multiport interconnect structure. Namely, the time for simulating such a circuit undesirably tends to increase by an order of $O(N^3)$ as the number of ports (N) of the multiport interconnect structure increases.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
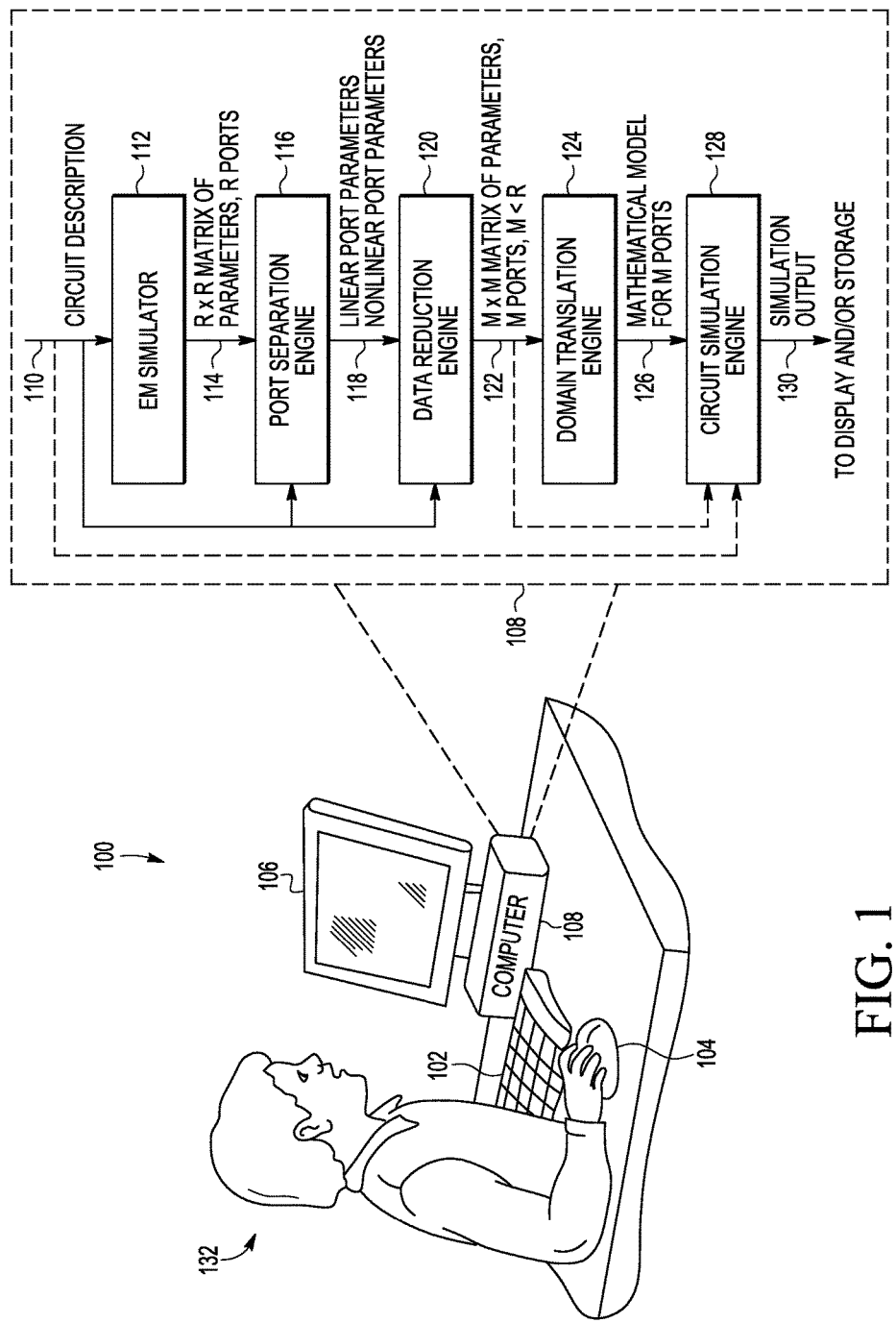
FIG. 1 is a simplified block diagram illustrating a system for facilitating simulation of a circuit connected to a multiport interconnect structure, in accordance with an embodiment.

The present disclosure is illustrated by way of example and is not limited by the accompanying figures, in which like reference numbers indicate similar elements. Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

The apparatus and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein. Also, the functions included in the flow diagrams do not imply a required order of performing the functionality contained therein.

DETAILED DESCRIPTION

Embodiments in accordance with the present teachings can be used to reduce the amount of data used to perform a circuit simulation for an original circuit package that contains a circuit having a plurality of circuit elements connected to a multiport interconnect structure. More particularly, a port separation engine coupled to a data reduction engine receives a first set of data that models the electrical behavior of the multiport interconnect structure and some of the plurality of circuit elements. The port separation engine and data reduction engine cooperatively operate to generate a second set of reduced data that models electrical behavior of a second interconnect structure that has fewer ports than the multiport interconnect structure but that is electrically equivalent to the multiport interconnect structure. Subsequent circuit simulation processing performed on the reduced second set of data enables the circuit simulation of an electrically equivalent circuit package, which contains the remaining plurality of circuit elements connected to the second interconnect structure, in less time than the circuit simulation of the original circuit package.

In accordance with an embodiment of the present teachings is a method performed by a circuit simulation system to facilitate simulating a first circuit package containing a first circuit having a plurality of circuit elements connected to a first multiport interconnect structure having a first set of ports. The method includes: receiving a first set of data that models electrical behavior of the first set of ports of the multiport interconnect structure and that models electrical behavior of a first portion of the plurality of circuit elements of the first circuit; and determining a first subset of the first data, which models electrical behavior of a set of exposed ports of the first set of ports of the first multiport interconnect structure, and a second subset of the first data, which models electrical behavior of a set of non-exposed ports of the first set of ports of the first multiport interconnect structure and that models the electrical behavior of the first portion of the plurality of circuit elements of the first circuit. The method further includes combining the second subset of the first data for the set of non-exposed ports and the first portion of the plurality of circuit elements into the first subset of the first data for the set of exposed ports to generate a second set of data that models electrical behavior of a second interconnect structure having fewer ports than the first multiport interconnect structure.

In accordance with another embodiment is a circuit simulation system for facilitating simulation of a first circuit package containing a first circuit having a plurality of circuit elements connected to a first multiport interconnect structure having a first set of ports, The circuit simulation system that includes a port separation engine coupled to a data reduction engine. The port separation engine is configured to receive a first set of data that models electrical behavior of the first set of ports of the multiport interconnect structure and that models electrical behavior of a first portion of the plurality of circuit elements of the first circuit; and determine a first subset of the first data, which models electrical behavior of a set of exposed ports of the first set of ports of the first multiport interconnect structure, and a second subset of the first data, which models electrical behavior of a set of non-exposed ports of the first set of ports of the first multiport interconnect structure and that models the electrical behavior of the first portion of the plurality of circuit elements of the first circuit. The data reduction engine is configured to combine the second subset of the first data for the set of non-exposed ports and the first portion of the plurality of circuit elements into the first subset of the first data for the set of exposed ports to generate a second set of data that models electrical behavior of a second interconnect structure having fewer ports than the first multiport interconnect structure. As used herein, both a portion and a subset of a set is meant to refer to less than all of the elements of a set with a plurality of elements. In some embodiments, a set may contain a single element such that there is no subset or portion of the set.

Prior to describing the figures, it will be useful to define some of the terminology used or referred to herein. A circuit, also referred to herein as an electrical or electronic system, contains multiple devices, which are also called circuit elements or components. A device has at least one terminal for: receiving an electrical signal such as a voltage, current, or electrical charge provided by a driver or control device or circuit; and/or providing a response to a received electrical signal. A circuit package contains a circuit connected to, e.g., by being mounted on or to, housed on or within, or enclosed or encased by, an interconnect structure. An interconnect structure, within a circuit package, contains at least one terminal, also referred to as a lead or contact pin and referred to herein as a port, used to couple a circuit within a circuit package to an external device or circuit. A port is a point of contact at which electrical signals enter or exit a network. A network is a device or circuit that is modeled or simulated using one or more components of a circuit simulation system. An electrically equivalent circuit or simply and equivalent circuit of a given circuit refers to a theoretical circuit that retains all of the electrical characteristics of the given circuit and that is generated by performing mathematical operations on data that electrically characterizes or models the given circuit.

Turning now to a description of the figures, FIG. 1 is a block diagram illustrating a simplified circuit simulation system 100 that can be used to simulate a circuit package that includes a circuit connected to a multiport interconnect structure, in accordance with an embodiment. FIG. 1 shows a user 132 that can interface with a computer 108 of the system 100, by providing input using a keyboard 102 and a point-and-click device 104, such as a mouse, of the system 100. The system 100 further includes an output component 106 shown as a display, which provides visual output to the user 132 such as visual output of various data. The embodiment of computer 108 shown in FIG. 1 includes an electromagnetic (EM) simulator 112, a port separation engine 116, a data reduction engine 120, a domain translation engine 124, and a circuit simulation engine 128, which are configured to implement embodiments of the present teachings. A computer architecture that can incorporate the circuit simulation system 100 is described later by reference to FIG. 5.

In general, in accordance with some embodiments of the present teachings, the electromagnetic simulator 112, port separation engine 116, data reduction engine 120, domain translation engine 124, and circuit simulation engine 128 operate as follows to simulate a circuit package having a first circuit, with a plurality of circuit elements, connected to a multiport interconnect structure. The electromagnetic simulator 112 is configured to generate a set of data that models the electrical behavior of a device that is characterized as a distributed circuit element, such as a multiport interconnect structure. In a particular embodiment, the set of data is an R×R matrix of frequency domain parameters, where R is the number of ports in a first set of ports of the multiport interconnect structure.

The port separation engine 116 is configured to receive the set of data that models the electrical behavior of the multiport interconnect structure and data that models the electrical behavior of a first portion of the plurality of circuit elements of the first circuit, e.g., at least some of the linear circuit elements, connected to the multiport interconnect structure. This received data is collectively referred to herein, in at least some embodiments, as a "first" set of data. In an embodiment, the entirety of the first set of data is received from the EM simulator 112. In another embodiment, the EM simulator 112 only provides the data that models the electrical behavior of the multiport interconnect structure, and the remaining data that models the electrical behavior of the first portion of the circuit elements is obtained elsewhere for instance based on user input describing the circuit package. The port separation engine 116 is further configured to determine a first subset of the first data, which models electrical behavior of a set of exposed ports of the multiport interconnect structure, and a second subset of the first data, which models electrical behavior of a set of non-exposed ports of the multiport interconnect structure and that models the electrical behavior of the first portion of the circuit elements, for instance as connected to the non-exposed ports. For example, the port separation engine 116 is configured to determine the first subset of the first data for the set of exposed ports to include data for all nonlinear ports of the multiport interconnect structure and to determine the second subset of the first data for the set of non-exposed ports to include data for at least a portion of all linear ports of the multiport interconnect structure.

The data reduction engine 120 is configured to combine the second subset of the first data for the non-exposed ports and the first portion of the circuit elements into the first subset of the first data for the exposed ports to generate a reduced second set of data that models electrical behavior of a second interconnect structure having a second set of ports containing fewer ports than the first set of ports of the multiport interconnect structure. In a particular embodiment, the reduced second set of data is an M×M matrix of frequency domain parameters, where M is the number of ports in the second set of ports of the second interconnect structure, and M<R. The domain translation engine 124 is configured to apply rational fitting and passivity enforcement to the M×M matrix of frequency domain parameters to generate a reduced order mathematical model of the second interconnect structure having the second set of ports.

The circuit simulation engine 128 is configured, in a particular implementation scenario, to perform a time-domain simulation of operation or behavior of a second circuit package that includes a remaining portion of the plurality of circuit elements of the first circuit connected to the second interconnect structure, wherein the second circuit package is electrically equivalent to the first circuit package. In another implementation scenario, the circuit simulation engine 128 is configured to perform a frequency domain simulation the operation of the second circuit package. In any event, the circuit simulation engine uses models of the devices within the circuit package to predict the electrical behavior of the system in response to applied signals, such as applied voltages and/or currents. In a particular embodiment, the circuit simulation engine 128 is a SPICE-based circuit simulation engine.

Figure 2:
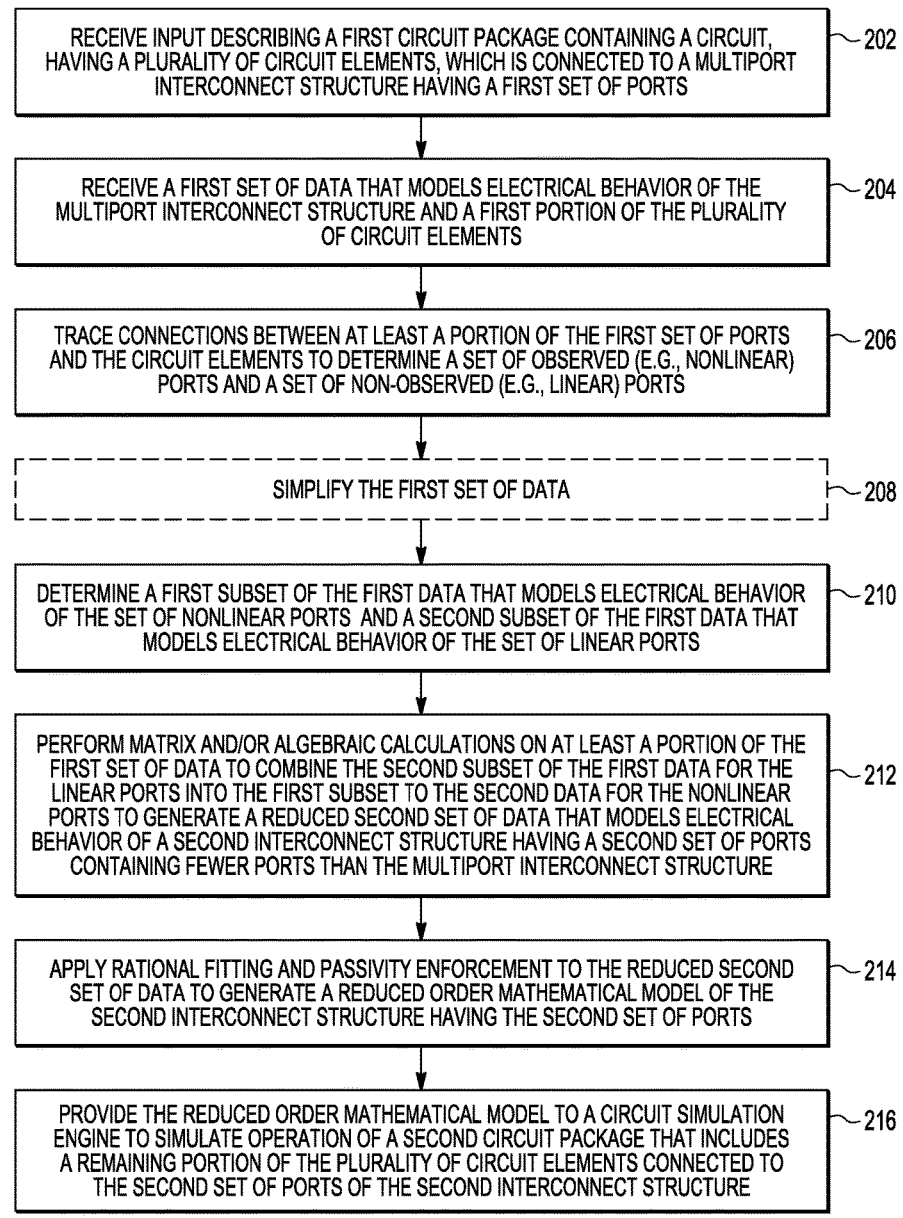
FIG. 2 is a flow diagram illustrating a method for facilitating simulation of a circuit connected to a multiport interconnect structure, in accordance with an embodiment.

Details of the operation of the components 112, 116, 120, 124, and 128 of the computer 108 to perform circuit simulation for a circuit connected to a multiport interconnect structure, in accordance with embodiments of the present disclosure, are next described by reference to FIGS. 2-4. The arrowed lines between the components 112, 116, 120, 124, and 128 indicate connections between the components as well as the flow of data into and out of the components. Turning initially to FIG. 2, a flow diagram is shown that illustrates a method 200, in accordance with the present teachings, for facilitating simulation of a circuit package that includes a circuit connected to a multiport interconnect structure. In a particular implementation, the user 132 want to simulate the circuit package shown in FIG. 3, which includes a single multiport interconnect structure 302 connected to a circuit 300. However, the present teachings can be applied to facilitate simulating any circuit package containing at least one multiport interconnect structure. For purposes of the present teachings, the circuit package that a user inputs into the circuit simulation system is the original circuit package containing an original circuit connected to an original multiport interconnect structure. With respect to the circuit package shown in FIG. 3, the circuit 300 is the original circuit, and the multiport interconnect structure 302 is the original multiport interconnect structure.

For example, the circuit 300 may schematically represent one or more ICs or portions thereof such as one or more microprocessors and/or memory chips or portions thereof. The multiport interconnect structure 302 is or represents a casing or structure that can be formed from metal, glass, plastic, or combinations thereof, for instance, and that has a set of one or more contact pins or leads used to connect or couple a housed, e.g., encased, enclosed, mounted or otherwise connected, circuit such as the circuit 300, to an external device such as a printed circuit board (PCB) or driver circuit. The interconnect structure 302 may also be configured, by for instance having a certain shape or thickness and/or using a particular material to build the interconnect structure, to protect the circuit 300 connected thereto from impact and corrosion.

Figure 3:
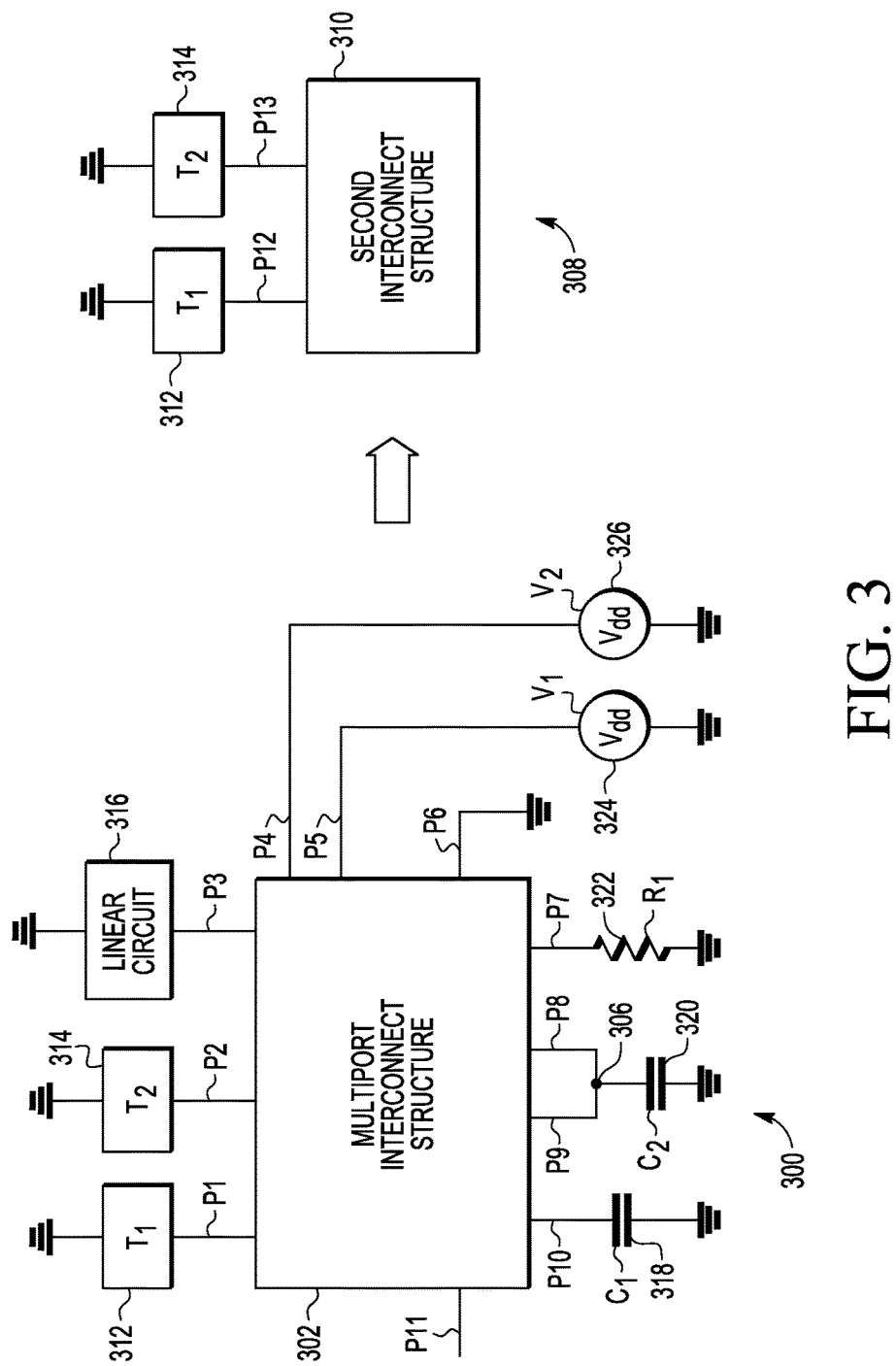
FIG. 3 is a partial block and schematic diagram illustrating a reduction of ports while facilitating simulation of a circuit connected to a multiport interconnect structure, in accordance with an embodiment.

As shown in FIG. 3, the multiport interconnect structure 302 includes eleven (11) ports $P_1$, $P_2$, $P_3$, $P_4$, $P_5$, $P_6$, $P_7$, $P_8$, $P_9$, $P_{10}$, and $P_{11}$. Thus, in this case, the number of ports, R, of the multiport interconnect structure equals 11. The circuit package shown in FIG. 1 includes a single multiport interconnect structure 302 with a relatively small number of ports for ease of illustrating concepts in accordance with the present teachings. However, for complex circuit simulations, the circuit package can include multiple interconnect structures one or more of which can include ports totaling tens or hundreds of ports or over a thousand ports in some instances. The benefits of the present teachings become more profound as the number of ports increases.

Turning again to the circuit package of FIG. 3, the circuit 300 includes the circuit elements of: a capacitor $C_1$ 318, a capacitor $C_2$ 320, a resistor $R_1$ 322, a voltage source $V_1$ 324 that provides a voltage having a magnitude of $V_{dd}$, a voltage source $V_2$ 326 that provides a voltage having a magnitude of $V_{dd}$, a linear circuit 316 that includes one or more linear elements only, a transistor $T_1$ 312, and a transistor $T_2$ 314. In some circuit arrangements, at least two of the circuit elements are connected or joined together by one or more of its terminals at a point referred to herein as a node. However, such internal connections between components and also connections for some of the terminals of some circuit elements, such as connections for some of the terminals of the transistors $T_1$ and $T_2$, are not shown for simplicity.

Nonetheless, the connections between the circuit elements 312, 314, 316, 318, 320, 322, 324, and 326 and the ports of the multiport interconnect structure 302 are schematically shown. Particularly, the transistor $T_1$ 312 is connected between port $P_1$ and a voltage common, in this case electrical ground or simply ground. Transistor $T_2$ 314 is connected between port $P_2$ and ground. The linear circuit 316 is connected between port $P_3$ and ground. The voltage source $V_2$ 326 is connected between port $P_4$ and ground. The voltage source $V_1$ 324 is connected between port $P_5$ and ground. Port $P_6$ is directly connected to ground. The resistor $R_1$ 322 is connected between port $P_7$ and ground. The capacitor $C_2$ 320 is connected between ground and a node 306, which connects to both port $P_8$ and port $P_9$. Capacitor $C_1$ 318 is connected between port $P_{10}$ and ground, and port $P_{11}$ is left open.

Turning again to method 200 of FIG. 2, the computer 108 receives 202 input 110 from the user 132 describing a circuit package containing a circuit having a plurality of circuit elements, which is connected to a multiport interconnect structure having a first set of ports containing R number of ports. In a particular embodiment, the user 132 provides input 110 used to describe the circuit package containing the circuit 300 connected to the multiport interconnect structure 302. In an example implementation, the circuit package is described using a texted-based description such as a netlist and/or other suitably formatted text-based description that is created by the user 132. Alternatively or in addition thereto, the text-based description is automatically generated from a circuit diagram that the user 132 provides to the computer 108 using one or more of the input components 102 and/or 104 or using an interface (not shown) on the computer 108, such as a Universal Serial Bus (USB) interface that connects to an external storage device such as a USB flash drive from which the circuit diagram is retrieved. The circuit description contains or refers to descriptions of the parts or devices, including the multiport interconnect structure, contained in the circuit package and the connections therebetween. Moreover, in an embodiment, the circuit description contains or refers to definitions of parts or devices contained in the circuit package and lists connections that can be made to that type of device or part and basic properties of the device or part.

To simulate a circuit package, for instance the circuit package of FIG. 3, the circuit simulation engine uses mathematical models of each of the devices within the circuit package. Where the circuit package is intended for operation in lower ranges, for instance in the tens or hundreds of kilohertz, the circuit simulation engine 128 may be able to perform an accurate enough simulation using compact models within a library of models, which approximate the behavior the all of the devices within the circuit package including the behavior of the multiport interconnect structure.

However, in another scenario, the circuit package is planned for operation in a frequency range where a compact model does not accurately represent every device in the circuit package, for instance where the wavelength approaches the physical dimensions of the one or more of the devices. Such devices can be characterized as distributed circuit elements with complicated behavior that is a function not only of inputs to the device, but also a function of how the device was assembled, operating conditions of the device, e.g., temperature, frequency, etc. Thus, to enhance reliably simulating distributed circuit elements, the EM simulator generates a physical model for such devices based upon the physics of the device. The physical model takes into account selected physical phenomenon or characteristics, which depend at least in part on the particular device for which the physical model is generated.

Accordingly, a part or portion of the input 110 that describes or characterizes one or more distributed circuit elements of the circuit package, for instance the part of the input 110 that describes or characterizes the multiport interconnect structure 302, is received into the EM simulator 112. The EM simulator 112 uses the received input data to generate a set of data, also referred to herein as modeling data, which mathematically models electrical behavior of the multiport interconnect structure 302, wherein at least a portion of the modeling data is provided to and received 204 by the port separation engine 116. The port separation engine 116 also receives data that models the electrical behavior of at least a first portion of the plurality of circuit elements of the circuit, e.g., 300, contained in the original circuit package, either from the EM simulator 112 or as part of the input 110. In an embodiment, the EM simulator 112 operates to determine a frequency response of the multiport interconnect structure 302 in terms of incident and reflected power waves at each port and to mathematically model the frequency response in terms of characteristics such as, but not limited to, signal delay, distortions, reflections, ringing, crosstalk, frequency-dependent losses, etc. The set of data generated by the EM simulator 112, at least a portion of which is provided to the port separation engine 116, is frequency domain data that represents the frequency response of the multiport interconnect structure.

In a particular embodiment, the frequency domain data, generated by the EM simulator 112 and received by the port separation engine 116, includes an R×R matrix 114 of scattering parameters (S-parameters), where R is the number of ports of the multiport interconnect structure. In other embodiments, the frequency domain data could be or could be converted into admittance parameters (Y-parameters) or impedance parameters (Z-parameters). More particularly, the S-parameter matrix for an R-port interconnect structure contains $R^2$ elements with each element or S-parameter at a particular frequency represented by a unitless complex number having a magnitude or amplitude and an angle or phase. The S-parameter data is the square of the dimension R because the frequency response is a consequence of the interaction by each port with every other port of the multiport interconnect structure 302. In addition, the S-parameters change with the measurement frequency, so frequency is specified for any S-Parameter measurement. Also specified is: characteristic or network impedance, often 50 Ohms; the allocation of port numbers; and conditions that may affect the network such as temperature, control voltage, bias current, etc., where applicable.

Thus, for the 11 port interconnect structure 302 of FIG. 3, in one implementation, the port separation engine 116 receives an 11×11 S-parameter matrix having S-parameter data determined at a number of different operating frequencies, such as 1.5 GHz, 2 GHz, 2.5 GHz, 3 GHz, 3.5 GHz, 4 GHz, 4.5 GHz, 5 GHz, 5.5 GHz, 6 GHz, 6.5 GHz, 7 GHz, and 7.5 GHz. This translates to 121 instances of S-Parameter data for each of 13 frequencies. However, for a multiport interconnect structure with 100 ports or 1000 ports, the S-Parameter matrices and corresponding S-parameter data that would have to be manipulated in subsequent engines, e.g., the domain translation engine 124 and the circuit simulation engine 128, would quickly get unwieldy.

The present disclosure effectively reduces the amount of data ultimately provided to the circuit simulation engine 128 in order to reduce the amount of time for performing the circuit simulation for a system that includes, for instance, a circuit connected to a multiport interconnect structure. Where the initial data includes an R×R matrix of parameters, reducing the data includes reducing the dimension of the matrix to an M×M matrix, where M<R. In accordance with the present teachings, the port separation engine 116 facilitates the data reduction using one or more techniques. Primarily, the port separation engine 116 separates 206, 210, respectively, the first set of ports and the corresponding first set of modeling data into multiple subsets. A first subset of the first data models the electrical behavior of a set of exposed ports of the R number of ports, and a second subset of the first data models the electrical behavior of a set of non-exposed ports of the R number of ports and models the electrical behavior of the portion of the circuit elements of the original circuit package.

Exposed ports are defined as those ports, selected based on modeling data for the original multiport interconnect structure, that will be driven during the actual circuit simulation by the circuit simulation engine 128. A port is driven when it receives a signal, such as a voltage or a current signal, during the circuit simulation by the circuit simulation engine 128. The ports of the original multiport interconnect structure that are not selected for being driven during the circuit simulation are defined as non-exposed ports. In accordance with the present teachings, the non-exposed ports and the circuit elements connected to the non-exposed ports have their representative modeling data, for instance its frequency response data, combined into the modeling data for the exposed ports. Thus, without the present teachings, all of the ports of the original multiport interconnect structure are driven during the circuit simulation. However, in accordance with the present teachings, only some selected ports of the original multiport interconnect structure are driven during the circuit simulation, as explained in more detail below. In a particular embodiment, the ports selected as exposed ports are only the ports that would be exposed to a driver circuit if the original circuit package were actually manufactured and operated.

In a further embodiment, the ports of the multiport interconnect structure to be simulated, e.g., the multiport interconnect structure 302, and the corresponding first set of modeling data are separated 206, 210, based upon whether ports are linear versus nonlinear. Namely, the first subset of the first data for the set of exposed ports includes data for all nonlinear ports of the multiport interconnect structure. The second subset of the first data for the set of non-exposed ports includes data for a first set, e.g., at least some of the, linear ports of the multiport interconnect structure. For a circuit package that includes a multiport interconnect structure connected to a circuit containing multiple circuit elements, a linear port is defined as a port that connects to a group of one or more the circuit elements, which are only linear circuit elements. For the same circuit package, a nonlinear port is defined as a port that connects to a group of one or more the circuit elements, which includes at least one nonlinear circuit element. A linear circuit element exhibits a linear relationship between input current and output voltage. Resistors, capacitors, inductors, and transformers are examples of linear circuit elements. By contrast, a nonlinear circuit element does not have a linear relationship between input current and voltage. Examples of nonlinear circuit elements are diodes, buffers, and transistors.

In one particular embodiment, to determine the linear and nonlinear ports of a multiport interconnect structure, e.g. an original multiport interconnect structure within an original circuit package, the port separation engine 116 traces 206 connections between at least some of the first set of R ports of the multiport interconnect and circuit elements of the circuit within the original circuit package. In some use case scenarios not all of the ports are connected to circuit elements, for example where ports are connected directly to ground with no intervening circuit element or ports that are left open; so tracing connections to circuit elements would not be applicable for those particular ports. However with respect to the tracing function 206 for those ports connected to at least one circuit element, the port separation engine 116 reviews the input data 110 that describes the circuit elements and their connectivity to ports of the multiport interconnect structure with the circuit package.

In one example implementation, for each port connected to at least one circuit element, the port separation engine 116 traces 206 the connection from the port to ground and determines all the circuit elements connected together between that port and ground, which therein form a group of circuit elements that is connected at a node to that particular port. When all of the circuit elements in the group are linear circuit elements, the port is deemed a linear port. However, when one or more circuit elements within the group is a nonlinear circuit element, the port is deemed a nonlinear port. All of the nonlinear ports become a part of the set of observed ports. In one implementation scenario, only the nonlinear ports are the observed ports for purposes of the circuit simulation that the analysis engine 128 performs. In another implementation scenario, the user 132 desires to observe a linear port during the circuit simulation, and selects this port to be included in the subset of observed ports. In such a case, the remaining linear ports, not included in the observed ports, make up the set of non-observed ports. Otherwise the set of non-observed ports includes all of the linear ports.

The data for the observed ports, in this example, the data that models the electrical behavior of the nonlinear ports, is designated as the data within the first subset of the first set of data for the set of exposed ports. Likewise, the data for the non-observed ports, in this example, the data that models the electrical behavior of the linear ports and the linear elements connected to those ports, is designated as the data within the second subset of first set of data for the set of non-exposed ports and connected circuit elements. The port separation engine 116 provides the separated data 118, e.g., the frequency domain data such as the S-parameter, Y-parameter, or Z-parameter data, for the observed, e.g., nonlinear, ports and the non-observed, e.g., linear, ports and connected linear circuit elements to the data reduction engine 120.

Turning momentarily to the circuit package shown in FIG. 3, the port separation engine 116 can separate 206 the observed, e.g., nonlinear ports, from the non-observed, e.g., linear ports, as follows. The group of circuit elements connected between port $P_1$ and ground contains only the transistor $T_1$ 312, thereby making this port a nonlinear port. The group of circuit elements connected between port $P_2$ and ground contains only the transistor $T_2$ 314, thereby making this port a nonlinear port. The group of circuit elements connected between port $P_3$ and ground contains only the linear circuit 316, which includes only linear circuit elements, thereby making this port a linear port. The group of circuit elements connected between port $P_4$ and ground contains only the voltage source $V_2$ 326, thereby making this port a linear port. The group of circuit elements connected between port $P_5$ and ground contains only the voltage source $V_1$ 324, thereby making this port a linear port. The group of circuit elements connected between port $P_7$ and ground contains only the resistor $R_1$ 322, thereby making this port a linear port. The group of circuit elements connected between port $P_8$ and ground contains only the capacitor $C_2$ 320, thereby making this port a linear port. The group of circuit elements connected between port $P_9$ and ground contains only the capacitor $C_2$ 320, thereby making this port a linear port. The group of circuit elements connected between port $P_{10}$ and ground contains only the capacitor $C_1$ 318, thereby making this port a linear port. Accordingly, nonlinear ports $P_1$ and $P_2$ are included in the subset of observed ports, and the S-parameter data corresponding to these ports is included 210 in the first subset of the S-parameter data. Unless otherwise selected for inclusion in the subset of observed ports, linear ports $P_3$, $P_4$, $P_5$, $P_7$, $P_8$, $P_9$, and $P_{10}$ are included in the subset of non-observed ports, and the S-parameter data corresponding to these ports is included 210 in the second subset of the S-parameter data along with S-parameter data for the linear circuit elements 316, 318, 320, 322, 324, and 326 connected to those linear ports.

Depending on how the circuit within the circuit package interconnects with the ports of the multiport interconnect structure, the first set of data, in this case the R×R matrix of S-parameter data, may be simplified 208 while or after it is separated 210 based on whether the corresponding ports are observed or non-observed. As used herein, "simplifying" data includes any data reduction outside of the data reduction as a consequence of the data reductions engine 120 combining 212 the data for non-exposed ports into the data for exposed ports in accordance with the present teachings. For example, the port separation engine 116 simplifies 208 the data that it receives based on one or more of: combining, from the first set of data, the data for multiple ports that are connected together; removing, from the first set of data, the data for each port that is connected to a voltage common or left open; or combining, from the first set of data, the data for multiple ports that are connected together from different interconnect structures of the multiport interconnect structure.

Returning again to the circuit package shown in FIG. 3. The port $P_6$ is connected directly to a voltage common, e.g., ground. Accordingly, the row and column, within the S-parameter matrix for the interconnect structure 302, which corresponds to the S-parameter data for port $P_6$ can be removed from the S-parameter matrix since there would be no electrical reaction at this port during actual operation. In addition, as can be seen, the S-parameter data corresponding to the ports $P_8$ and $P_9$ that are connected together can be combined to simplify the S-parameter matrix, for the interconnect structure 302. In an embodiment, combining the data for the ports $P_8$ and $P_9$ involves adding the columns and rows, which correspond to ports $P_8$ and $P_9$, within the S-parameter matrix for the interconnect structure 302. Accordingly, for the multiport structure 302, the port separation engine 116 provides to the data reduction engine 120 at least the separated S-parameter data 118, namely, the subset of S-parameter data for the nonlinear ports $P_1$ and $P_2$ and the subset of S-parameter data for the linear ports $P_3$, $P_4$, $P_5$, $P_7$, combined $P_8$ & $P_9$, and $P_{10}$.

Figure 4:
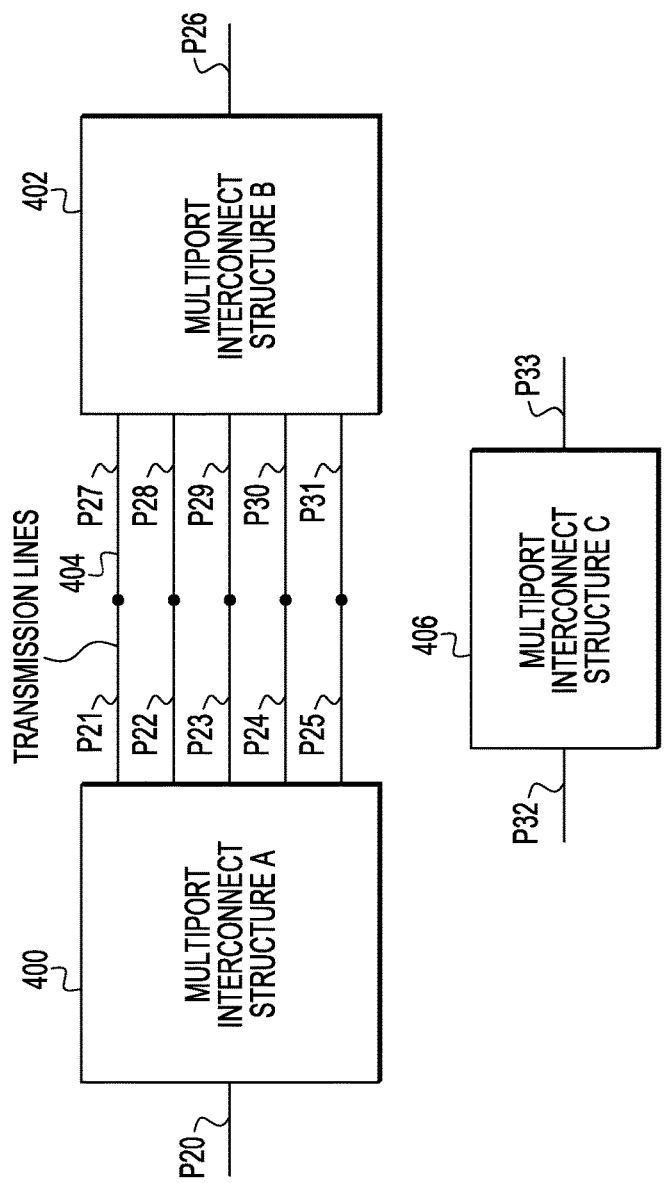
FIG. 4 is a block diagram illustrating reduction of ports while facilitating simulation of a circuit connected to a multiport interconnect structure, in accordance with an embodiment.

FIG. 4 illustrates data simplification where ports from multiple, in this case two, multiport interconnect structures A 400 and B 402 are connected together. In an implementation scenario, a first circuit package contains an IC connected to the interconnect structure 400, and a second package contains a different IC connected to the interconnect structure 402. Interconnect structure 400 contains ports $P_{20}$, $P_{21}$, $P_{22}$, $P_{23}$, $P_{24}$, and $P_{25}$. Interconnect structure 402 contains ports $P_{26}$, $P_{27}$, $P_{28}$, $P_{29}$, $P_{30}$ and $P_{31}$. As shown, port $P_{21}$ is connected to port $P_{27}$. Port $P_{22}$ is connected to port $P_{28}$. Port $P_{23}$ is connected to port $P_{29}$. Port $P_{24}$ is connected to port $P_{30}$. Port $P_{25}$ is connected to port $P_{31}$. In an embodiment, the packages that include interconnect structures 400 and 402 can be simplified to a single package model with the modeling data combined, e.g., added, for the ports that are connected together. Multiport interconnect structure C 406 having ports $P_{32}$ and $P_{33}$ represents the simplified model and is electrically equivalent to the interconnect structure 400 and 402. The data simplification with respect to the ports $P_6$, $P_8$ & $P_9$, and port $P_{11}$ described earlier and with respect to the ports shown in FIG. 4 can be performed by the port separation engine 116 or the data reduction engine 120 or both.

Turing back to the method 200 illustrated by reference to FIG. 2, upon receiving the modeling data 118 separated into the first subset of the data for the exposed ports and the second subset of the data for the non-exposed ports and the linear circuit elements, the data reduction engine 120 combines 212 the data for the non-exposed ports and the linear circuit elements into the data for the exposed ports. In essence, the modeling data for an R-port interconnect structure is remapped, e.g., through mathematical manipulation of the modeling data, to an M-port interconnect structure, where M<R. This generates a reduced set of data that models electrical behavior for a second interconnect structure having a second set of M number of ports containing fewer ports that the set of R ports of the first interconnect structure. However, the M-port interconnect structure is electrically equivalent to the R-port interconnect structure connected to the linear circuit elements for purposes of the remaining or subsequent circuit simulation processing. In an embodiment, the second set of M number of ports, which will be presented to the circuit simulation engine 120, contains that same number of ports as the exposed ports determined from the R-port interconnect structure.

By combining the modeling data for the non-exposed ports and the linear circuit elements into the modeling data for the exposed ports, all of the modeling data for the original multiport interconnect structure and at least some of the linear circuit elements is encapsulated into fewer ports in order to reduce the time for the circuit simulation. The data reduction is performed mathematically, so that the circuit simulation is performed on a reduced port interconnect structure that is electrically equivalent to the original multiport interconnect structure connected to the linear circuit elements. Accordingly, the modeling data that characterizes the reduced ports is a function of all of the modeling data that characterizes the original multiport interconnect structure and at least some of the original linear circuit elements. Thus, a form of the reduced second set of modeling data, e.g., either the frequency data itself or a reduced order model of the data, can be provided to the circuit simulation engine 128. The analysis engine 128 then simulates operation of a second circuit package that includes a remaining portion of the plurality of circuit elements, e.g., the non-linear circuit elements, of the original circuit connected to the second interconnect structure, wherein the second circuit package is electrically equivalent to the original first circuit package input at 110 into the circuit simulation system 108. This leads to fewer computations performed in less time on the reduced data in subsequent processing in order to simulate an accurate representation or equivalent model of the original circuit package.

Where the modeling data includes frequency domain data, such as S-parameter, Y-parameter, or Z-parameter data, combining 212 the data for the non-exposed ports into the data for the exposed ports entails performing matrix calculations, such as matrix algebra to generate a reduced second set of data that includes an M×M matrix 122 of scattering, admittance, or impedance parameters, where M is the number of ports in the second reduced set of ports. Moreover, the R×R matrix and the M×M matrix each include parameters determined across a same frequency band or range of frequencies. For the circuit package 300 shown in FIG. 3 for instance, in accordance with the present teachings, the S-parameter data corresponding to the linear ports $P_3$, $P_4$, $P_5$, $P_7$, combined $P_8$ & $P_9$, and $P_{10}$ and the linear elements connected to those ports can be mathematically combined into the S-parameter data for the nonlinear ports $P_1$ and $P_2$. This results in a mathematical model for a second interconnect structure 310 having M=2 ports $P_{12}$ and $P_{13}$, which is electrically equivalent to the multiport interconnect structure 302 connected to the linear elements 316, 318, 320, 322, 324, and 326. Moreover, this enables simulation, by the circuit simulation engine 128, of a circuit package 308 containing the second interconnect structure 310 connected to the non-linear circuit elements 312 and 314 that would be electrically equivalent to the circuit simulation of the original circuit package containing the multiport interconnect structure 302 connected to the original circuit 300.

In one example implementation, combining the second subset of the first data for the set of non-exposed ports and the linear circuit elements into the first subset of the first data for the set of exposed ports to generate the reduced second set of data includes performing matrix calculations using: a form of the first set of data; voltage responses for both the subset of non-exposed ports and the subset of exposed ports;

and current responses only for the subset of exposed ports. As used herein, a "form" of any particular data may mean all of the data, some or the data, or the data after applying one or more mathematical operations or functions.

For example, the port separation engine 116 provides the Y-parameter data separated by nonlinear versus linear ports or provides S-parameter or Z-parameter data that is converted to Y-parameter data by the data reduction engine 120. In one embodiment, the data reduction engine 120 forms matrix equation (1) at every frequency, for instance at frequencies of 1.5 GHz, 2 GHz, 2.5 GHz, 3 GHz, 3.5 GHz, 4 GHz, 4.5 GHz, 5 GHz, 5.5 GHz, 6 GHz, 6.5 GHz, 7 GHz, and 7.5 GHz for the circuit package of FIG. 3.

$$\begin{bmatrix} Y_{NN} & Y_{NL} \\ Y_{LN} & Y_{LL} \end{bmatrix} \begin{bmatrix} V_N \\ V_L \end{bmatrix} = \begin{bmatrix} I_N \\ 0 \end{bmatrix}, \quad (1)$$

where
$Y_{NN}$ is the explicit coupling between the nonlinear ports;
$Y_{LN}$ is the explicit dependence of the current at the linear ports on the voltages at the nonlinear ports . . . ;
$Y_{NL}$ is the explicit dependence of the current at the nonlinear ports on the voltages at the linear ports;
$Y_{LL}$ is the explicit coupling between the linear ports;
$V_N$ is the vector of port voltages at the nonlinear ports;
$V_L$ is the vector of port voltages at the linear ports . . . ;
$I_N$ is the vector of injected currents at the nonlinear ports In equation (1), $I_L$ is zero because all internal nodes satisfy Kirchhoff's current law. Current is only injected at the nonlinear ports.

Next, at each frequency, the data reduction engine 120 performs the calculations to eliminate all of the $V_L$ variables, resulting in equation (2) below $$[Y_{NN} - Y_{NL} Y_{LL}^{-1} Y_{LN}][V_N] = [I_N]. \quad (2)$$

These calculations can be done with Y, Z, or S-parameters. As can be seen, equation (2) has a smaller dimension, i.e., is of a lesser order, than equation (1) and is already solved for the linear ports. Accordingly, extracting the modeling, e.g., S-, Y-, or Z-parameter, data from equation (2), yields fewer data points for subsequent processing such as domain translation is the domain translation engine 124 and circuit simulation in the circuit simulation engine 128.

In one embodiment, the data reduction engine 120 provides reduced frequency domain data 122 directly to the circuit simulation engine 128. In this embodiment, the circuit simulation engine 128 includes a harmonic balance analysis engine that performs a harmonic balance analysis of high frequency circuits. The harmonic balance analysis engine is a frequency domain solver that performs frequency domain formulation of circuit equations that, for example, arise from an application of Kirchhoff's laws and the circuit elements' constitutive relations. The reduced frequency domain data generated by the present teachings enables the solving of fewer equations in the frequency domain resulting in time savings even where a harmonic balance analysis engine is used.

In an alternative embodiment, the circuit simulation engine 128 includes a transient analysis engine that performs the circuit simulation in the time domain. In this case, the frequency domain data, e.g., S-parameter, Y-parameter, and Z-parameter data, that models the interconnect structure is too complicated for analysis by the transient analysis engine. Therefore, the frequency domain data is first provided to the domain translation engine 124 for translating 214 the frequency domain data or model into a lower order time domain data or model.

In one example implementation, the domain translation engine 124 receives the reduced frequency response data 122 and approximates 214 this data by fitting it to a rational function, also referred to as vector fitting, which is essentially a pole-zero fit of the data. In addition, to prevent instability during the circuit simulation, passivity must be enforced by satisfying a passivity criterion. Passivity of a system indicates the inability of the system to generate energy. The domain translation engine 124 can apply algorithms to the reduced frequency domain data 122 to apply 214 the rational fitting and passivity enforcement to generate a reduced order mathematical model to provide 216 as input for a transient circuit simulation. Any suitable rational fitting and passivity enforcement algorithms can be applied, including those known in the art. The vector fitting and passivity enforcement can involve manipulating the frequency domain data, the computational complexity being $O(R^3)$ which can become extremely time consuming as the number of ports increases. Therefore, decreasing the number of ports and corresponding frequency domain data points analyzed by the domain translation engine 124 can produce a significant time saving for simulating circuit packages that include one or more interconnect structures have a large number of ports.

For an M×M matrix 122 of parameters, e.g., S-, Y-, or Z-parameter data, this involves the domain translation engine 124 applying 214 rational fitting and passivity enforcement to the M×M matrix of parameters to generate a reduced order mathematical model 126 of the second interconnect structure having the second set of M number of ports, for presenting 216 to the time-domain circuit simulation engine 128. Another possible benefit of reducing the amount of frequency response data that is subjected to passivity enforcement is that, in some instances, a more accurate first passivity enforcement algorithm can be applied to the M×M matrix of parameters than a second passivity enforcement algorithm that would have been applied to the R×R matrix of parameters. The more accurate first passivity enforcement algorithm allows passivity to be tested over more frequency points than the second passivity enforcement algorithm.

Upon receiving the mathematical model, e.g., the reduced order mathematical model for the second interconnect structure having the fewer number of ports, the circuit simulation engine 128 performs the time-domain circuit simulation for instance of the circuit package 308 containing the second interconnect structure 310 connected to the non-linear circuit elements 312 and 324. In an embodiment, the circuit simulation involves provision of initial conditions, e.g., initial input values and operating conditions, of the circuit package at a particular time along with information about how input values change over time, if any. Analysis can further involve translating the listing of the devices in the circuit package, their connections, and the models for the devices into equations to be solved. For example, the general equations produced are nonlinear differential algebraic equations solved using, for instance, implicit integration methods, Newton's method, and sparse matrix techniques. This involves evaluating mathematical descriptions of the nonlinear models by solving for various values of current, charge, and derivatives of those values at the various terminals of the devices in the circuit package. This evaluation is generally the most costly in terms of time and resources. However, the time for performing this evaluation can be reduced by reducing the amount of data input into the circuit simulation engine 128, in accordance with the present teachings.

The circuit simulation engine 128 provides output values 130 that can be stored or presented to the user in at least one visual form. For example, the output values 130 can be used to plot curves or otherwise display the output data 130 on a display screen such as the display screen 106.

Figure 5:
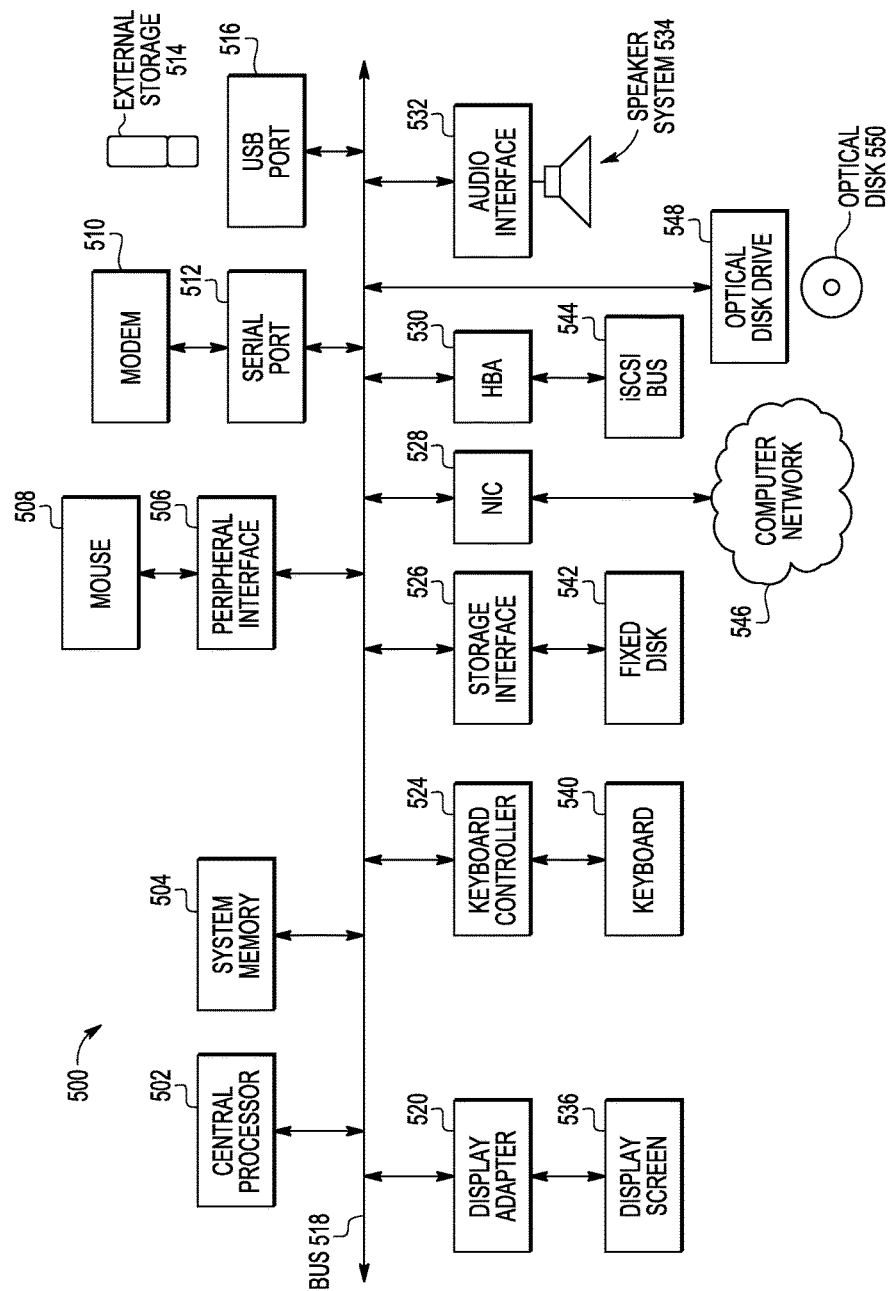
FIG. 5 is a simplified block diagram illustrating a computer system suitable for implementing a method and system for facilitating simulation of a circuit connected to a multiport interconnect structure, in accordance with an embodiment.

FIG. 5 depicts a block diagram of a computer system 500 suitable for implementing aspects of the present teachings. For example, the computer system 500 represents the computer system 100 shown in FIG. 1. Computer system 500 includes a bus 518 that interconnects major hardware subsystems of the computer 500 such as: a central processor 502; system memory 504, which can be a random access memory (RAM) implemented as main memory for the computer 500, but system memory 504 can also include one or more of read only memory (ROM), flash RAM, etc., as a single or multiple hardware memory devices; a peripheral interface 506; a serial port 512; a USB port 516; a display adapter 520; a keyboard controller 524; a storage interface 526; a network interface controller (NIC) 528; a host bus adapter (HBA) 530, also referred to as a converged network adaptor; an optical disk drive 548; and an audio interface 532. Many other devices and subsystems (not shown) may be connected in a similar manner. Conversely, all of the devices shown in FIG. 5 need not be present to practice the present teachings. Moreover, the devices and subsystems can be interconnected in different ways from that shown in FIG. 5.

The central processor 502 is configured, in at least one embodiment, to execute one or more software and/or firmware applications or programs, referred to herein as applications, which can be stored in the system memory 504. For example, the central processor 502 executes programs to control the operation of the computer as a whole such as an operating system (OS). In another example implementation, the central processor 502 executes applications to implement the EM simulator 112, the port separation engine 116, the data deduction engine 120, the domain translation engine 124, and the circuit simulation engine 128 of FIG. 1, in accordance with the present teachings. In one particular embodiment, central processor 502 represents a single processor implementing the computer components 112, 116, 120, 124, and 128 of FIG. 1. In an alternative embodiment, the central processor 502 represents multiple hardware units configured to implement the OS and components 112, 116, 120, 124, and 128 of FIG. 1.

The peripheral interface 506 represents hardware operative to connect peripheral devices to the computer 500 such as a mouse 508, which can represent the mouse 104 of FIG. 1, or another type of peripheral device such as a headset or earpiece. In one particular embodiment, the peripheral interface 506 includes transceiver hardware that supports short-ranged communications such as Bluetooth communications, and the like, to create wireless links to wireless enabled devices. The serial port 512 represents one or more physical interfaces that support communicating serial data streams. In the particular implementation shown, serial port 506 is operative to interface with a modem 510 to connect to an external server for instance. In one example implementation, serial port 512 is compliant with the RS-232 standard. However, serial port 512 can support other interfaces including, but not limited to, an Ethernet interface, a FireWire Interface, etc.

The USB port 516 is compliant with the USB standard and can be configured as a receptacle to receive a standard, mini, or micro USB plug to connect to devices such as an external storage 514 like a flash drive or other electronic devices including peripheral devices such as a keyboard, a point-and-click device, a printer, etc. The display adapter 520 can be an expansion card used to provide graphic images to a display screen 536 of a monitor, such as the monitor 106 of FIG. 1, connected to the computer 500. The keyboard controller 524 is operative to interface an external keyboard 540, which can represent the keyboard 102 of FIG. 1 for instance, to the central processor 502 by alerting the central processor 502 when a key is pressed and providing the keyboard input for processing. In an embodiment, the keyboard controller 524 functionality is contained within the USB port 516.

The storage interface 526 is configured to connect a standard computer-readable medium for storage and/or retrieval of information such as a fixed disk drive 542 that may or may not be an internal component of the computer 500. The NIC 528 is configured to connect the computer 500 to a computer network 546. For example, the NIC 528 includes the electronic circuitry required to wirelessly communicate using a specific physical layer and data link layer protocol such as Wi-Fi. This provides a base for a full network protocol stack, allowing communication with a computer network 546. This can facilitate communication among small groups of computers on a same local area network (LAN) and large-scale network communications through routable protocols, such as Internet Protocol (IP). The HBA 530 connects the computer 500 to an external device or system such as external storage facility using a bus 544. In this case, bus 544 is configured to implement Internet Small Computer System Interface (iSCSI), which is an IP-based storage networking standard for linking data storage facilities. The optical disk drive 548 is configured to receive an optical disk storage device 550; and the audio interface 532 is configured to connect an external audio device, such as an external speaker system 534, to the computer 500.

In the foregoing specification, specific embodiments have been described. However, one of ordinary skill in the art appreciates that various modifications and changes can be made without departing from the scope of the disclosure as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendment made during the pendency of this application and all equivalents of those claims as issued.

For the sake of brevity, conventional techniques related to circuit simulation and modeling, various laws within which circuits operate such as Kirchoff's law, solving partial and ordinary differential equations, matrix mathematics, and other functional aspects of a circuit and package system may not be described in detail. Furthermore, the connecting lines shown in the various figures contained herein are intended to represent example functional relationships and/or physical couplings between the various elements. It should be noted that many alternative or additional functional relationships or physical connections may be present in a practical embodiment.

Moreover in this document, the terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%.

As used herein, the term "configured to", "configured with", "arranged to", "arranged with", "capable of" and any like or similar terms means that referenced elements have a physical arrangement and/or physical coupling and/or connectivity with other elements in an inactive state. This physical arrangement and/or physical coupling and/or connectivity while in the inactive state enables the elements to perform stated functionality while in the active state.

The above description refers to nodes or features being "connected" or "coupled" together. As used here and, unless expressly stated otherwise, "coupled" means that one node or feature is directly or indirectly joined to or is in direct or indirect communication with another node or feature, and not necessarily physically. As used herein, unless expressly stated otherwise, "connected" means that one node or feature is directly joined to or is in direct communication with another node or feature. Furthermore, although the various circuit schematics shown herein depict certain example arrangement of elements, additional intervening elements, devices, features, or components may be present in an actual embodiment, assuming that the functionality of the given circuit is not adversely affected.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method for circuit simulation comprising:
receiving, by a circuit simulation system, input describing a first circuit package that is used to fabricate a first circuit having a plurality of circuit elements connected to a first multiport interconnect structure having a first set of ports;
generating, by the circuit simulation system, a first set of modeling data that models electrical behavior of the first set of ports of the first multiport interconnect structure and a first portion of the circuit elements of the first circuit package;
generating, by the circuit simulation system from the first set of modeling data, a second reduced set of modeling data that models electrical behavior of a second interconnect structure having fewer ports than the first multiport interconnect structure and that is electrically equivalent to the first multiport interconnect structure connected to the first portion of the circuit elements of the first circuit package;
simulating, by a circuit simulation processor of the circuit simulation system, operation of a second circuit package comprising the second interconnect structure connected to a second remaining portion of the circuit elements of the first circuit package to generate circuit simulation results for the first circuit package, wherein the simulating uses the second reduced set of modeling data that models the electrical behavior of the second interconnect structure and modeling data that models electrical behavior of the remaining portion of the circuit elements of the first circuit package;
generating a revised design for the first circuit based results of the simulating operation of the second circuit package.

2. The method of claim 1, wherein the first set of modeling data comprises a set of frequency domain data that models the electrical behavior of the first multiport interconnect structure.

3. The method of claim 2, wherein the set of frequency domain data comprises an R×R matrix of scattering, admittance, or impedance parameters, where R is the number of ports in the first set of ports.

4. The method of claim 3, wherein the second reduced set of modeling data comprises an M×M matrix of scattering, admittance, or impedance parameters, where M is the number of ports of the second interconnect structure, and M<R.

5. The method of claim 4, wherein the R×R matrix and the M×M matrix each comprise parameters determined across a same frequency band.

6. The method of claim 4 further comprising applying rational fitting and passivity enforcement to the M×M matrix of parameters to generate a reduced order mathematical model of the second interconnect structure for presenting to a time-domain circuit simulation engine.

7. The method of claim 6, wherein applying the passivity enforcement comprises applying a more accurate first passivity enforcement algorithm to the M×M matrix of parameters than a second passivity enforcement algorithm applied to the R×R matrix of parameters.

8. The method of claim 1, wherein generating the second reduced set of modeling data comprises:
determining a first subset of the first set of modeling data, which models electrical behavior of a set of exposed ports of the first set of ports of the first multiport interconnect structure, and a second subset of the first set of modeling data, which models electrical behavior of a set of non-exposed ports of the first set of ports of the first multiport interconnect structure and that models the electrical behavior of the first portion of the plurality of circuit elements of the first circuit;
combining the second subset of the first set of modeling data for the set of non-exposed ports and the first portion of the plurality of circuit elements into the first subset of the first set of modeling data for the set of exposed ports to generate the second reduced set of modeling data.

9. The method of claim 8, wherein combining the second subset of the first set of modeling data for the set of non-exposed ports and the first portion of the plurality of circuit elements into the first subset of the first set of modeling data for the set of exposed ports to generate the second reduced set of modeling data comprises performing matrix calculations using: a form of the first set of modeling data; voltage responses for both the set of non-exposed ports and the set of exposed ports; and current responses only for the set of exposed ports.

10. The method of claim 1 further comprising simplifying the first set of data.

11. The method of claim 10, wherein simplifying the first set of data comprises at least one of:
combining, from the first set of data, the data for multiple ports that are connected together;
removing, from the first set of data, the data for each port that is connected to a voltage ground or this left open; or
combining, from the first set of data, the data for multiple ports that are connected together from different interconnect structures of the first multiport interconnect structure.

12. The method of claim 8, wherein the first subset of the first set of modeling data for the set of exposed ports comprises data for all nonlinear ports of the first multiport interconnect structure, and the second subset of the first set of modeling data for the set of non-exposed ports and the first portion of the plurality of circuit elements comprises data for a first set of linear ports of the first multiport interconnect structure.

13. The method of claim 12, wherein the first subset of the first set of modeling data for the set of exposed ports further comprises data for a second set of selected linear ports of the first multiport interconnect structure.

14. The method of claim 12 further comprising:
determining the set of exposed ports by tracing connections between the first set of ports and the plurality of circuit elements to determine the nonlinear ports, wherein each nonlinear port connects to a group of the plurality of circuit elements, which contains at least one nonlinear circuit element; and
determining the set of non-exposed ports by tracing connections between the first set of ports and the plurality of circuit elements to determine the first set of linear ports, wherein each linear port connects to a group of the first portion of the plurality of circuit elements, which contains only linear circuit elements.

15. The method of claim 8, wherein the second reduced set of modeling data models the electrical behavior of the second interconnect structure having the second number of ports equal to the number of exposed ports.

16. A circuit simulation system comprising:
an electromagnetic simulator configured to:
receive input describing a first circuit package that is used to fabricate a first circuit having a plurality of circuit elements connected to a first multiport interconnect structure having a first set of ports;
generate a first set of modeling data that models electrical behavior of the first set of ports of the first multiport interconnect structure and a first portion of the circuit elements of the first circuit package;
a port separation processor and a data reduction processor coupled to the electromagnetic simulator and configured to generate, from the first set of modeling data, a second reduced set of modeling data that models electrical behavior of a second interconnect structure having fewer ports than the first multiport interconnect structure and that is electrically equivalent to the first multiport interconnect structure connected to the first portion of the circuit elements of the first circuit package;
a circuit simulation processor configured to simulate operation of a second circuit package comprising the second interconnect structure connected to a second remaining portion of the circuit elements of the first circuit package to generate circuit simulation results for the first circuit package, wherein the simulating uses the second reduced set of modeling data that models the electrical behavior of the second interconnect structure and modeling data that models electrical behavior of the remaining portion of the circuit elements of the first circuit package;
a computer processor configured to generate a revised design for the first circuit based results of the simulation operation of the second circuit package.

17. The circuit simulation system of claim 16, wherein:
the port separation processor is configured to determining a first subset of the first set of modeling data, which models electrical behavior of a set of exposed ports of the first set of ports of the first multiport interconnect structure, and a second subset of the first set of modeling data, which models electrical behavior of a set of non-exposed ports of the first set of ports of the first multiport interconnect structure and that models the electrical behavior of the first portion of the plurality of circuit elements of the first circuit;
the data reduction processor is configured to combining the second subset of the first set of modeling data for the set of non-exposed ports and the first portion of the plurality of circuit elements into the first subset of the first set of modeling data for the set of exposed ports to generate the second reduced set of modeling data.

18. The circuit simulation system of claim 16, wherein the first set of modeling data comprises an R×R matrix of frequency domain parameters, where R is the number of ports in the first set of ports of the first multiport interconnect structure and wherein the second reduced set of modeling data comprises an M×M matrix of frequency domain parameters, where M is the number of ports of the second interconnect structure, and M<R, the circuit simulation system further comprising a domain translation processor coupled to the data reduction processor, wherein the domain translation processor is configured to apply rational fitting and passivity enforcement to the M×M matrix of frequency domain parameters to generate a reduced order mathematical model of the second interconnect structure.

19. The circuit simulation system of claim 18, wherein the circuit simulation processor is configured to perform a time-domain simulation of operation of the second circuit package.

20. The circuit simulation system of claim 17, wherein the port separation processor is configured to determine the first subset of the first set of modeling data for the set of exposed ports to include data for all nonlinear ports of the first multiport interconnect structure, and the second subset of the first set of modeling data for the set of non-exposed ports and the first portion of the plurality of circuit elements to include data for at least a portion of all linear ports of the first multiport interconnect structure.

* * * * *